(12) United States Patent
Okamoto et al.

(10) Patent No.: US 11,444,156 B2
(45) Date of Patent: Sep. 13, 2022

(54) SEMICONDUCTOR DEVICE

(71) Applicant: Mitsubishi Electric Corporation, Tokyo (JP)

(72) Inventors: Hayato Okamoto, Tokyo (JP); Ze Chen, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 57 days.

(21) Appl. No.: 16/858,274

(22) Filed: Apr. 24, 2020

(65) Prior Publication Data
US 2021/0036107 A1    Feb. 4, 2021

(30) Foreign Application Priority Data
Aug. 1, 2019 (JP) .............................. JP2019-142130

(51) Int. Cl.
H01L 29/06 (2006.01)

(52) U.S. Cl.
CPC ................................ H01L 29/0692 (2013.01)

(58) Field of Classification Search
CPC ... H01L 29/861; H01L 29/862; H01L 29/868; H01L 29/0646; H01L 29/0623; H01L 29/0692; H01L 29/0603
See application file for complete search history.

(56) References Cited

U.S. PATENT DOCUMENTS

| | | | |
|---|---|---|---|
| 6,049,108 A * | 4/2000 | Williams | H01L 29/7813 257/341 |
| 2013/0175549 A1 * | 7/2013 | Okumura | H01L 27/0255 257/77 |

(Continued)

FOREIGN PATENT DOCUMENTS

JP    2007-324428 A    12/2007

OTHER PUBLICATIONS

Li S.S. (2006) Metal-Semiconductor Contacts: chapter 10. In: Li S.S. (eds) Semiconductor Physical Electronics. Springer, New York, NY. https://doi.org/10.1007/0-387-37766-2_10 (Year: 2006).*

(Continued)

*Primary Examiner* — Vincent Wall
(74) *Attorney, Agent, or Firm* — Studebaker & Brackett PC

(57) ABSTRACT

Provided is a technique capable of improving performance of a semiconductor device. A semiconductor device includes a first semiconductor region of a first conductivity type, a second semiconductor region of a second conductivity type located on the first semiconductor region, third and fourth semiconductor regions of the second conductivity type, a fifth semiconductor region of the first conductivity type, and an electrode. The third semiconductor region is located on the second semiconductor region, and has a higher impurity concentration than the second semiconductor region. The fourth semiconductor region has a higher impurity concentration than the second semiconductor region, is located separately from the third semiconductor region in a planar view, and has contact with the second semiconductor region. The fifth semiconductor region is located on the second semiconductor region, and is located between the third and fourth semiconductor regions in a planar view. The electrode does not have contact with the fourth and fifth semiconductor regions but has contact with the third semiconductor region.

5 Claims, 15 Drawing Sheets

(56) References Cited

U.S. PATENT DOCUMENTS

2015/0162400 A1* 6/2015 Yano ................... H01L 29/0619
257/491
2020/0411680 A1* 12/2020 Nakamura .......... H01L 27/0727

OTHER PUBLICATIONS https://electronics.stackexchange.com/questions/310897/impedance-of-basic-mosfet-current-mirror, (Year: 2017).*

* cited by examiner

F I G. 9
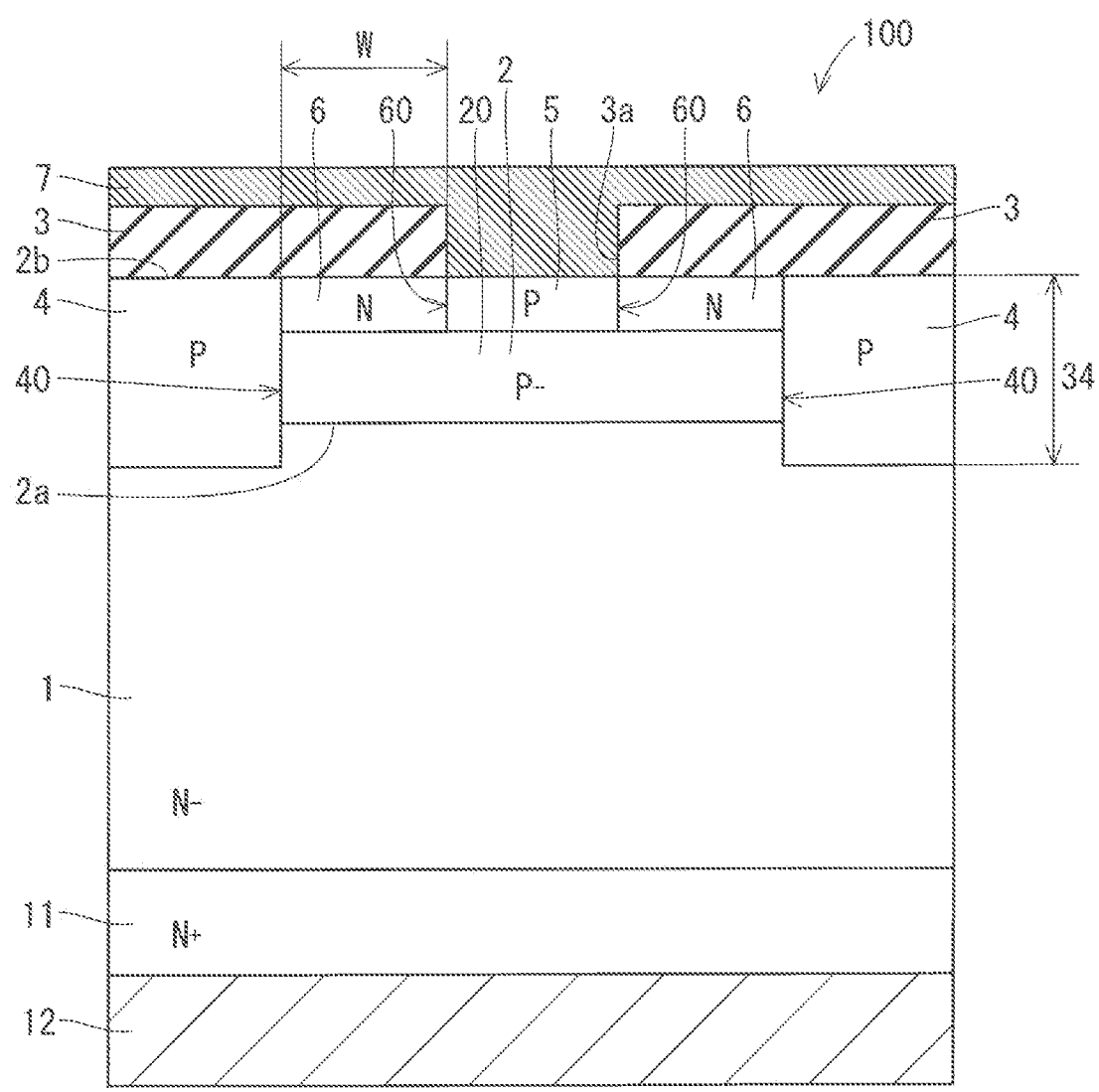

F I G. 1 1
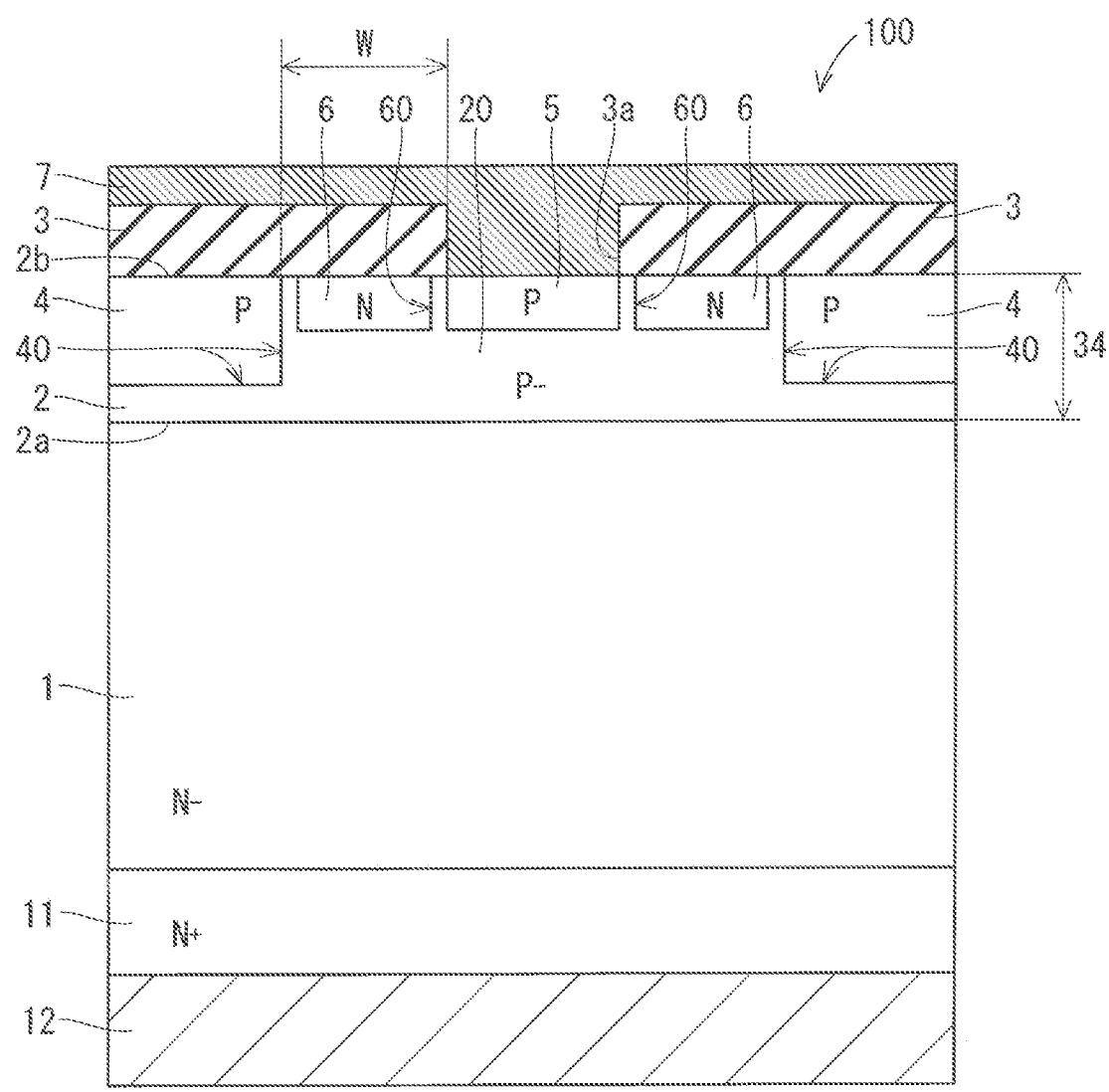

F I G. 1 4
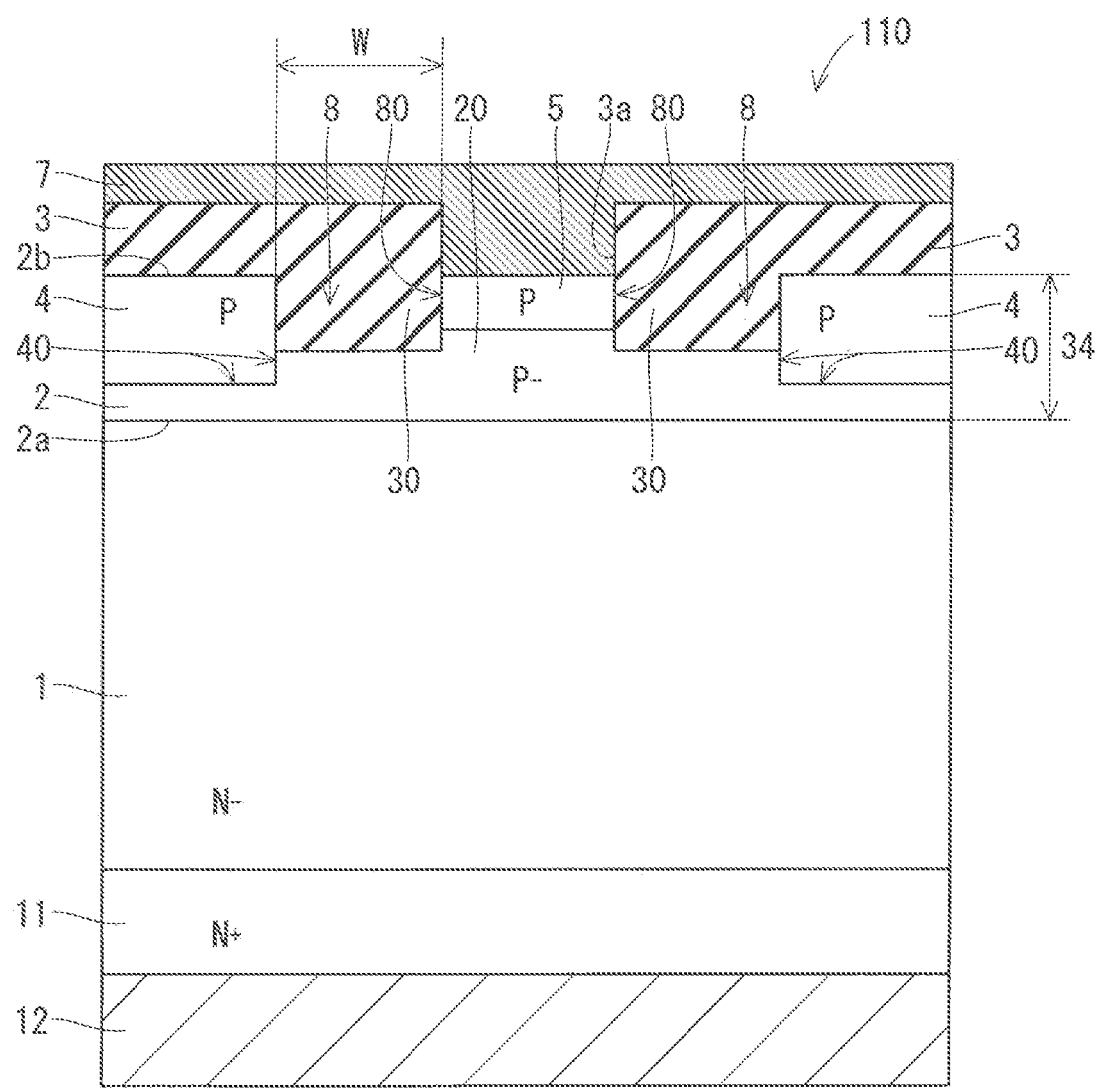

SEMICONDUCTOR DEVICE

BACKGROUND OF THE INVENTION

Field of the Invention

The present invention relates to a semiconductor device.

Description of the Background Art

Japanese Patent Application Laid-Open No. 2007-324428 describes a technique relating to a semiconductor device.

Semiconductor devices 150 and 160 according to FIGS. 1 and 2 are first described. FIG. 1 is a drawing illustrating a cross-sectional structure of the semiconductor device 150. FIG. 2 is a drawing illustrating a cross-sectional structure of the semiconductor device 160. Each of the semiconductor devices 150 and 160 is a PIN diode, for example. Each of FIGS. 1 and 2 illustrates a cross-sectional structure of a cell part of the diode. The semiconductor devices 150 and 160 are referred to as the first comparative device 150 and the second comparative device 160 in some cases hereinafter.

As illustrated in FIG. 1, the first comparative device 150 includes a cathode electrode 12, an N+ type cathode region 11, an N− type intermediate semiconductor region 1, a P type anode region 14, and an anode electrode 7.

Indicated herein is that the N+ type region has a higher donor impurity concentration than the N type region, and the N− type region has a lower donor impurity concentration than the N type region. Also indicated is that the P− type region has a lower acceptor impurity concentration than the P type region. Uncapitalized p type and n type are used hereinafter in a case of not specifying the impurity concentration but simply specifying a conductivity type. A simple description of "concentration" indicates the impurity concentration, and a simple description of "peak concentration" indicates the peak concentration of impurity.

The cathode region 11 is located on the cathode electrode 12. The intermediate semiconductor region 1 is located on the cathode region 11. The anode region 14 is located on the intermediate semiconductor region 1. The anode electrode 7 is located on the anode region 14.

In order to improve recovery characteristics of the first comparative device 150 having the structure described above, it is effective to reduce an amount of positive hole accumulated in the first comparative device 150 while a forward bias is applied to the first comparative device 150. When the concentration of the anode region 14 is reduced, the amount of positive hole supplied from the anode region 14 at the time of forward bias decreases. As a result, the amount of positive hole accumulated in the first comparative device 150 at the time of forward bias decreases, and the recovery characteristics are improved.

However, when the concentration of the anode region 14 is reduced, a depletion layer extends easily from the intermediate semiconductor region 1 toward the anode region 14 at the time of application of a reverse bias to the first comparative device 150. As a result, there is a possibility that the depletion layer reaches the anode electrode 7 and the first comparative device 150 breaks down.

The forward bias indicates a voltage applied between the anode electrode 7 and the cathode electrode 12 so that potential of the anode electrode 7 gets higher than potential of the cathode electrode 12. The forward bias is also referred to as the forward bias voltage. In the meanwhile, the reverse bias indicates a voltage applied between the anode electrode 7 and the cathode electrode 12 so that potential of the anode electrode 7 gets lower than potential of the cathode electrode 12. The reverse bias is also referred to as the reverse bias voltage.

The second comparative device 160 is equivalent to the improved first comparative device 150. As illustrated in FIG. 2, the second comparative device 160 is equivalent to the first comparative device 150 which includes an anode region 24 in place of the anode region 14 and further includes an insulating film 3.

The anode region 24 is located on the intermediate semiconductor region 1. The anode region 24 includes a P− type semiconductor region 2 and a P type semiconductor region 4. The semiconductor region 2 includes a main surface 2a having contact with the intermediate semiconductor region 1 and a main surface 2b on an opposite side of the main surface 2a. The semiconductor region 4 is formed in the semiconductor region 2. The semiconductor region 4 is formed in part of the semiconductor region 2. The semiconductor region 4 extends from the main surface 2b of the semiconductor region 2 to a side of the main surface 2a, but does not reach the main surface 2a. A depth of the semiconductor region 4 is smaller than that of the semiconductor region 2. The semiconductor region 4 includes a region 40 sandwiching part 20 of the semiconductor region 2 in a planar view. The region 40 is considered to sandwich the part 20 of the semiconductor region 2 in a direction perpendicular to a depth direction of the semiconductor region 2 (in other words, a thickness direction of the second comparative device 160) in a cross-sectional view of the second comparative device 160. As can also be seen by FIG. 2, the semiconductor region 4 is also considered to be located on the semiconductor region 2. In the description of the second comparative device 160 hereinafter, the semiconductor region 2 indicates the region where the semiconductor region 4 is not formed in the semiconductor region 2 unless otherwise noted. The part 20 of the semiconductor region 2 is referred to as the partial region 20 in some cases.

The insulating film 3 is located on the anode region 24. The insulating film 3 covers a whole region of the semiconductor region 4 in a planar view. The insulating film 3 covers part of the semiconductor region 2 in a planar view. The insulating film 3 includes an opening part 3a exposing part of the partial region 20 of the semiconductor region 2. The anode electrode 7 is formed on the insulating film 3 to fill the opening part 3a. Accordingly, the part of the semiconductor region 2 exposed from the opening part 3a and the anode electrode 7 have contact with each other. The insulating film 3 covers the whole region of the semiconductor region 4, thus the anode electrode 7 does not have contact with the semiconductor region 4. The anode electrode 7 is electrically connected to the semiconductor region 4 via the semiconductor region 2. The insulating film 3 is an oxide film, for example.

In the second comparative device 160 having the above structure, the anode electrode 7 and the semiconductor region 4 are electrically connected to each other via the semiconductor region 2 having a low impurity concentration. Thus, it is considered that there is a resistance component caused by the semiconductor region 2 between the anode electrode 7 and the semiconductor region 4. Accordingly, when the forward bias is applied to the second comparative device 160, potential of the semiconductor region 4 is equal to a value obtained by subtracting a value of voltage drop in the semiconductor region 2 from the potential of the anode electrode 7. Thus, when the forward bias is applied to the second comparative device 160, the potential of the semiconductor region 4 included in the anode region 24 is smaller than the potential of the anode electrode 7. Accordingly, the supply of the positive hole from the anode region 24 is suppressed, and an amount of accumulation of the positive hole in the second comparative device 160 decreases. As a result, recovery characteristics of the second comparative device 160 are improved.

In the second comparative device 160, the potential of the semiconductor region 4 is smaller than the potential of the anode electrode 7, thus the supply of the positive hole from the semiconductor region 4 can be suppressed, and the impurity concentration of the semiconductor region 4 can be set high. When the impurity concentration of the semiconductor region 4 is high, the semiconductor region 4 can suppress the extension of the depletion layer from the intermediate semiconductor region 1 to the anode region 24 at the time of application of the reverse bias to the second comparative device 160. Thus, a possibility of breakdown in the second comparative device 160 can be reduced.

Japanese Patent Application Laid-Open No. 2007-324428 described above discloses the structure similar to that of the second comparative device 160. In the structure disclosed in Japanese Patent Application Laid-Open No. 2007-324428, an impurity concentration of a region 32 corresponding to the semiconductor region 2 is set to $1 \times 10^{-17}$ cm$^{-3}$. In the structure disclosed in Japanese Patent Application Laid-Open No. 2007-324428, an impurity concentration of a region 34 corresponding to the semiconductor region 4 is set to $1 \times 10^{-19}$ cm$^{-3}$.

In order to further improve the recovery characteristics of the second comparative device 160, it is considered that an implantation efficiency of the positive hole from the anode region 24 is reduced by reducing the concentration of the semiconductor region 2. When the concentration of the semiconductor region 2 is reduced, there is a possibility that the semiconductor region 4 cannot sufficiently suppress the extension of the depletion layer generated from the intermediate semiconductor region 1 at the time of application of large reverse bias to the second comparative device 160. As a result, there is a possibility that the second comparative device 160 breaks down. When the concentration of the semiconductor region 2 is reduced, there is a possibility that an electrically favorable contact, that is to say, an ohmic contact cannot be achieved between the anode electrode 7 and the semiconductor region 2. Since there is a restriction on the concentration and depth of the semiconductor regions 2 and 4 for various reasons, it is difficult to increase a degree of improvement of the recovery characteristics in the second comparative device 160.

SUMMARY

Improvement in performance is desired in a semiconductor device.

The present invention therefore has been made to solve the above problems, and it is an object of the present invention to provide a technique capable of improving performance of the semiconductor device.

One aspect of a semiconductor device includes a first semiconductor region of a first conductivity type, a second semiconductor region of a second conductivity type located on the first semiconductor region, a third semiconductor region of the second conductivity type, a fourth semiconductor region of the second conductivity type, a fifth semiconductor region of the first conductivity type, and an electrode. The third semiconductor region is located on the second semiconductor region, and has a higher impurity concentration than the second semiconductor region. The fourth semiconductor region has a higher impurity concentration than the second semiconductor region, is located separately from the third semiconductor region in a planar view, and has contact with the second semiconductor region. The fifth semiconductor region is located on the second semiconductor region, and is located between the third and fourth semiconductor regions in a planar view. The electrode does not have contact with the fourth and fifth semiconductor regions but has contact with the third semiconductor region.

One aspect of a semiconductor device includes a first semiconductor region of a first conductivity type, a second semiconductor region of a second conductivity type located on the first semiconductor region, a third semiconductor region of the second conductivity type, a fourth semiconductor region of the second conductivity type, a concave portion formed on the semiconductor region, an insulating film filling the concave portion, and an electrode. The third semiconductor region is located on the second semiconductor region, and has a higher impurity concentration than the second semiconductor region. The fourth semiconductor region has a higher impurity concentration than the second semiconductor region, is located separately from the third semiconductor region in a planar view, and has contact with the second semiconductor region. The concave portion is located between the third and fourth semiconductor regions in a planar view. The electrode does not have contact with the fourth semiconductor region but has contact with the third semiconductor region.

The performance of the semiconductor device is improved.

These and other objects, features, aspects and advantages of the present invention will become more apparent from the following detailed description of the present invention when taken in conjunction with the accompanying drawings.

BRIEF DESCRIPTION OF THE DRAWINGS

FIG. 9 is a drawing illustrating an example of a cross-sectional structure of the semiconductor device.

FIG. 11 is a drawing illustrating an example of a cross-sectional structure of the semiconductor device.

FIG. 14 is a drawing illustrating an example of a cross-sectional structure of the semiconductor device.

DESCRIPTION OF THE PREFERRED EMBODIMENTS

Embodiment 1

Figure 1:
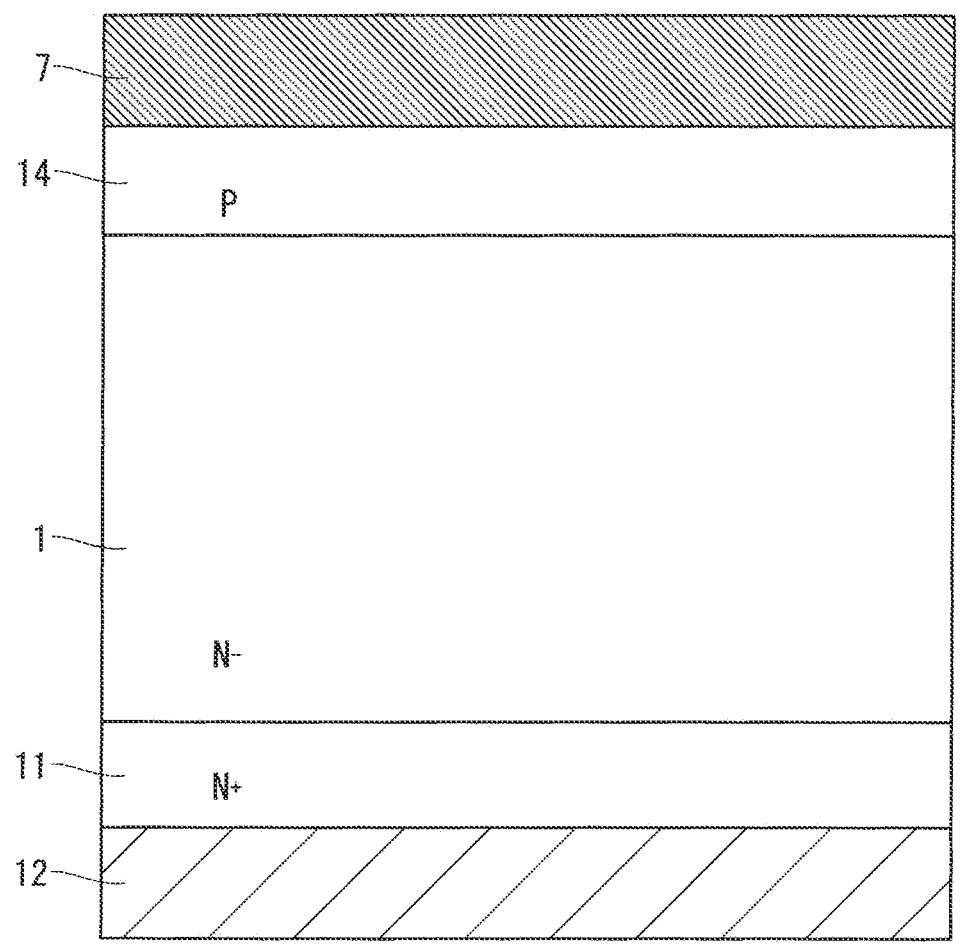
FIG. 1 is a drawing illustrating a cross-sectional structure of a first comparative device.
Figure 2:
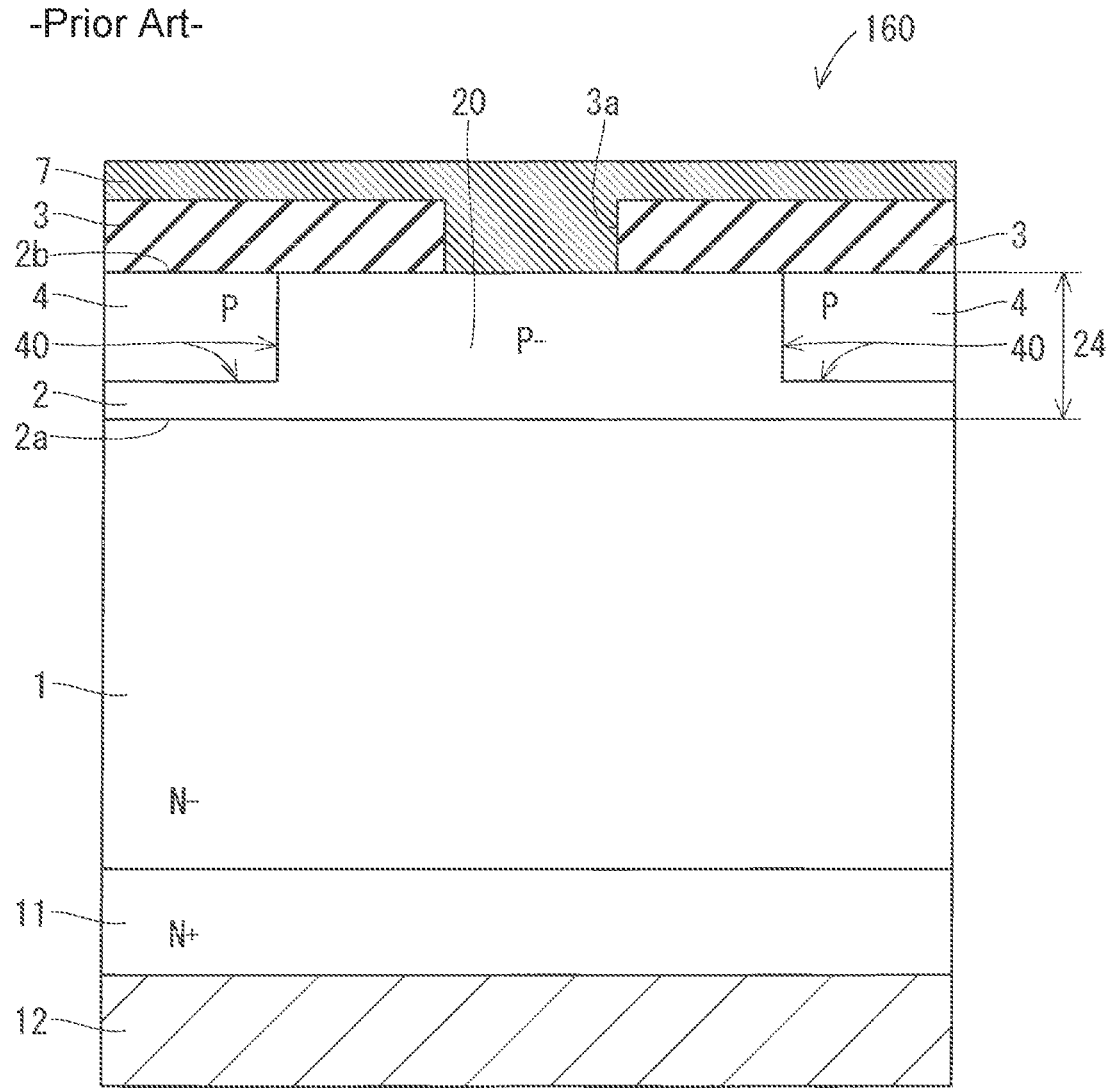
FIG. 2 is a drawing illustrating a cross-sectional structure of a second comparative device.
Figure 3:
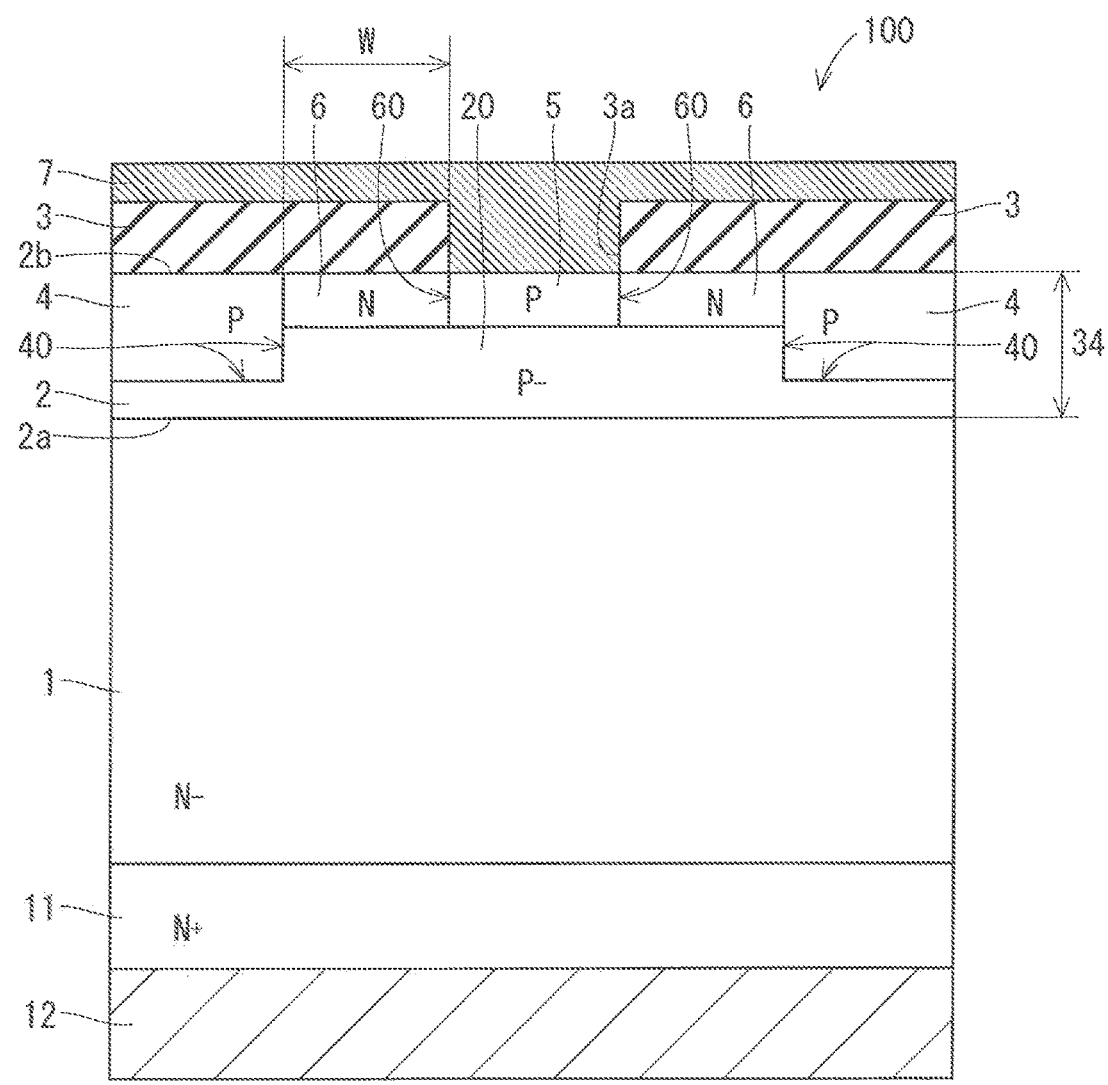
FIG. 3 is a drawing illustrating an example of a cross-sectional structure of a semiconductor device.

A semiconductor device 100 according to the present embodiment is equivalent to the improved second comparative device 160. FIG. 3 is a drawing illustrating an example of a cross-sectional structure of the semiconductor device 100 according to the present embodiment. The semiconductor device 100 is a PIN diode, for example. FIG. 3 illustrates a cross-sectional structure of a cell part of the diode. As illustrated in FIG. 3, the semiconductor device 100 is equivalent to the second comparative device 160 which includes an anode region 34 in place of the anode region 24 and further includes an N type semiconductor region 6.

A silicon semiconductor material is used in the semiconductor device 100, for example. A semiconductor material other than the silicon semiconductor material may also be used in the semiconductor device 100. For example, a gallium arsenide semiconductor material, a silicon carbide semiconductor material, or a gallium nitride semiconductor material may be used in the semiconductor device 100. Described hereinafter are various characteristics of the semiconductor device 100 and a configuration parameter in a case where the semiconductor device 100 is a diode having a withstand voltage level of 2.2 kV. When the withstand voltage of the semiconductor device 100 is not 2.2 kV, there may be a case where the various characteristics of the semiconductor device 100 and the configuration parameter are changed from the following contents.

The cathode electrode 12 is made of a layered metal material in which aluminum, titanium, and nickel are stacked, for example. The anode electrode 7 is made of aluminum, for example. A material of each of the cathode electrode 12 and the anode electrode 7 is not limited thereto.

The anode region 34 includes the semiconductor regions 2 and 4 described above and the P type semiconductor region 5. The semiconductor region 5 is formed in the partial region 20 of the semiconductor region 2. The semiconductor region 5 is formed in part of the partial region 20 of the semiconductor region 2. The semiconductor region 5 extends from the main surface 2b of the semiconductor region 2 to the side of the main surface 2a, but does not reach the main surface 2a. The semiconductor region 5 is formed to be shallower than the semiconductor region 4. The semiconductor region 5 is considered to be located on the partial region 20 of the semiconductor region 2.

The N type semiconductor region 6 is formed in the partial region 20 of the semiconductor region 2. The semiconductor region 6 is formed in part of the partial region 20 of the semiconductor region 2. The semiconductor region 6 extends from the main surface 2b of the semiconductor region 2 to the side of the main surface 2a, but does not reach the main surface 2a. The semiconductor region 6 is formed to be shallower than the semiconductor regions 2 and 4. A depth of the semiconductor region 6 is the same as that of the semiconductor region 5, for example. The semiconductor region 6 includes a region 60 sandwiching the semiconductor region 5 in a planar view. The region 60 is considered to sandwich the semiconductor region 5 in a direction perpendicular to a depth direction of the semiconductor region 5 in a cross-sectional view of the semiconductor device 100. The region 60 has contact with the semiconductor regions 4 and 5. The region 40 of the semiconductor region 4 sandwiches the region 60 of the semiconductor region 6 and the semiconductor region 5 in a planar view. The region 40 has contact with the region 60. The semiconductor region 6 is considered to be located on the partial region 20 of the semiconductor region 2. In the description hereinafter, the semiconductor region 2 indicates the region where the semiconductor regions 4, 5, and 6 are not formed in the semiconductor region 2 unless otherwise noted.

The region 40 of the semiconductor region 4 is formed separately from the semiconductor region 5 in a planar view. In other words, the region 40 is formed separately from the semiconductor region 5 in a direction perpendicular to a depth direction of the region 40 in a cross-sectional view of the semiconductor device 100. The region 60 of the semiconductor region 6 is located between the region 40 and the semiconductor region 5 in a planar view.

A peak concentration of each of the semiconductor regions 4 and 5 is higher than that of the semiconductor region 2. An upper limit value of the peak concentration of the semiconductor region 2 is set to $1 \times 10^{17}$ cm$^{-3}$, for example. A lower limit value of the peak concentration of the semiconductor region 2 is set to $1 \times 10^{15}$ cm$^{-3}$, for example. An upper limit value of the peak concentration of the semiconductor region 4 is set to $1 \times 10^{18}$ cm$^{-3}$, for example. A lower limit value of the peak concentration of the semiconductor region 4 is set to $1 \times 10^{16}$ cm$^{-3}$, for example. An upper limit value of the peak concentration of the semiconductor region 5 is set to $1 \times 10^{18}$ cm$^{-3}$, for example. A lower limit value of the peak concentration of the semiconductor region 5 is set to $1 \times 10^{16}$ cm$^{-3}$, for example.

The insulating film 3 is located on the anode region 34. The insulating film 3 covers a whole region of the semiconductor regions 4 and 6 in a planar view. The insulating film 3 does not cover the semiconductor region 5 in a planar view. The insulating film 3 includes the opening part 3a exposing the semiconductor region 5. The anode electrode 7 is formed on the insulating film 3 to fill the opening part 3a. Accordingly, the semiconductor region 5 exposed from the opening part 3a and the anode electrode 7 have contact with each other. The insulating film 3 covers the whole region of the semiconductor regions 4 and 6, thus the anode electrode 7 does not have contact with the semiconductor regions 4 and 6. The anode electrode 7 is electrically connected to the semiconductor region 4 via the semiconductor region 5 and the semiconductor region 2.

Figure 4:
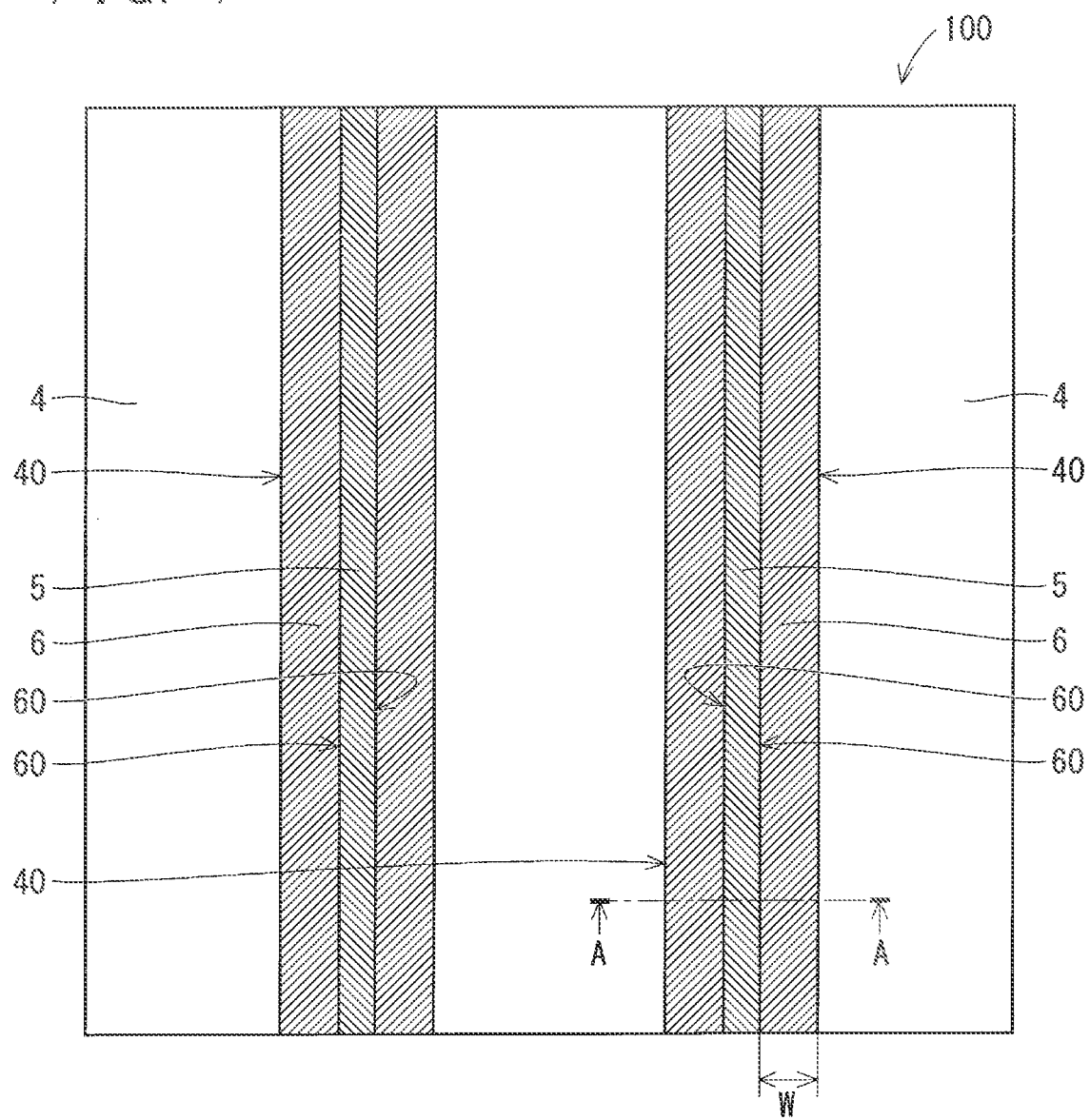
FIG. 4 is a drawing illustrating an example of a planar structure of the semiconductor device.
Figure 5:
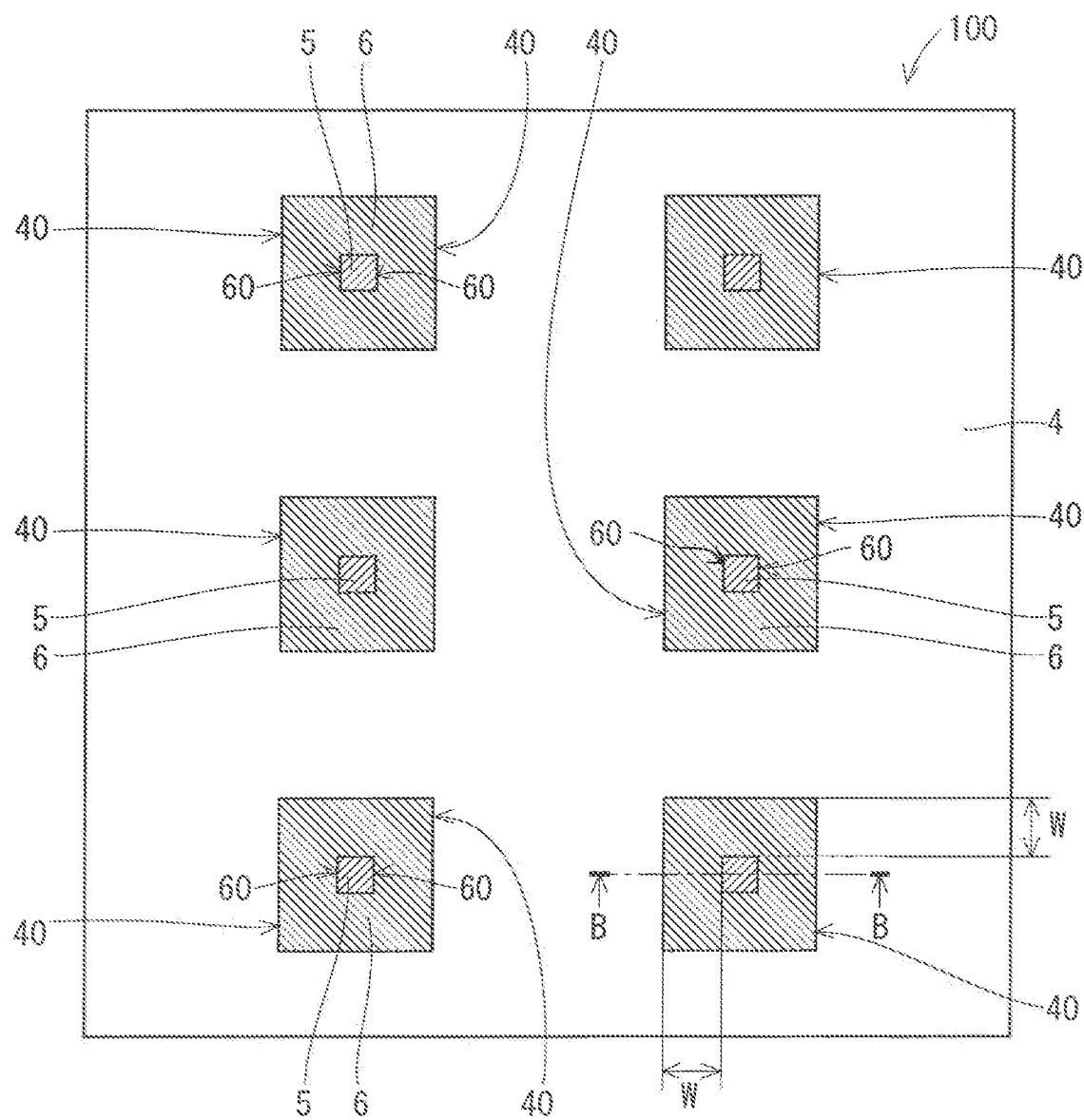
FIG. 5 is a drawing illustrating an example of a planar structure of the semiconductor device.

FIGS. 4 and 5 are drawings each illustrating an example of a planar structure of the semiconductor device 100. The illustration of the anode electrode 7 and the insulating film 3 is omitted in FIGS. 4 and 5. A cross-sectional structure in an arrow direction A-A in FIG. 4 is indicated by a cross-sectional structure illustrated in FIG. 3. A cross-sectional structure in an arrow direction B-B in FIG. 5 is indicated by a cross-sectional structure illustrated in FIG. 3.

In the example in FIG. 4, the semiconductor device 100 includes the plurality of semiconductor regions 5 and the plurality of semiconductor regions 6. The plurality of semiconductor regions 5 are formed in a striped pattern. Each semiconductor region 5 has an elongated rectangular shape in a planar view.

In the example in FIG. 5, the plurality of semiconductor regions 5 having substantially a square shape in a planar view are arranged in rows and columns. In the example in FIG. 5, the plurality of semiconductor regions 6 are formed to correspond to the plurality of semiconductor regions 5. Each semiconductor region 6 is formed to surround the semiconductor region 5 in a planar view. Also in the example in FIG. 5, the semiconductor region 6 includes the region 60 sandwiching the semiconductor region 5 in a planar view. An outline of the semiconductor region 6 in a planar view is formed into substantially a square shape.

In the semiconductor device 100 having the above structure, the anode electrode 7 and the semiconductor region 4 are electrically connected to each other via the semiconductor region 5 and the semiconductor region 2 having the low impurity concentration. Accordingly, when the forward bias is applied to the semiconductor device 100, the potential of the semiconductor region 4 is equal to a value obtained by subtracting a value of voltage drop in the semiconductor region 2 from the potential of the anode electrode 7. Thus, when the forward bias is applied to the semiconductor device 100, the potential of the semiconductor region 4 in the anode region 34 is smaller than the potential of the anode electrode 7. Furthermore, there is the n type semiconductor region 6 between the p type semiconductor region 5 having contact with the anode electrode 7 and the p type semiconductor region 4 in the semiconductor device 100. Thus, when the forward bias is applied to the semiconductor device 100, a current flowing from the semiconductor region 5 toward the semiconductor region 4 flows without passing through the n type semiconductor region 6. As a result, a current path in the semiconductor region 2 having the low concentration is elongated. Thus, the potential of the semiconductor region 4 in the case where the forward bias is applied to the semiconductor device 100 can be further reduced. Accordingly, the supply of the positive hole from the anode region 34 is suppressed, and an amount of accumulation of the positive hole in the semiconductor device 100 decreases. As a result, recovery characteristics of the semiconductor device 100 are improved. Specifically, a switching loss decreases and a switching wave form can be soft-switched. Thus, performance of the semiconductor device 100 is improved.

When the reverse bias is applied to the semiconductor device 100, the extension of the depletion layer from the intermediate semiconductor region 1 to the anode region 34 is suppressed not only by the semiconductor region 4 but also by the semiconductor region 5 having the high impurity concentration. Thus, a possibility of breakdown is lower in the semiconductor device 100 than in the second comparative device 160. That is to say, a static withstand voltage of the semiconductor device 100 can be improved.

The anode electrode 7 does not have contact with the semiconductor region 2 having the low concentration, but has contact with the semiconductor region 5 having the high concentration. Thus, even when the concentration of the semiconductor region 2 is set low, the ohmic contact between the anode electrode 7 and the semiconductor region 5 can be achieved. When the concentration of the semiconductor region 2 is set low, the resistance component caused by the semiconductor region 2 can be increased, thus the potential of the semiconductor region 4 in the case where the forward bias is applied to the semiconductor device 100 can be further reduced. Thus, the supply of the positive hole from the anode region 34 is further suppressed. As a result, in the semiconductor device 100, the ohmic contact between the anode electrode 7 and the anode region 34 is achieved, and the recovery characteristics are improved more than the case in the second comparative device 160.

As described in the above example, the upper limit value of the peak concentration of the semiconductor region 2 is set to $1\times10^{17}$ cm$^3$, thus the potential of the semiconductor region 4 in the case where the forward bias is applied to the semiconductor device 100 can be reduced. Thus, the supply of the positive hole from the anode region 34 is suppressed. As a result, the recovery characteristics of the semiconductor device 100 can be improved.

As described in the above example, the lower limit value of the peak concentration of the semiconductor region 2 is set to $1\times10^{15}$ cm$^{-3}$, thus the semiconductor region 2 having the low concentration can be formed easily.

As described in the above example, the upper limit value of the peak concentration of the semiconductor regions 4 and 5 is set to $1\times10^{18}$ cm$^3$, thus the supply of the positive hole from the anode region 34 including the semiconductor regions 4 and 5 is suppressed. Thus, the recovery characteristics of the semiconductor device 100 can be improved.

As described in the above example, the lower limit value of the peak concentration of the semiconductor region 5 is set to $1\times10^{16}$ cm$^3$, thus the ohmic contact between the anode electrode 7 and the semiconductor region 5 can be formed easily.

Figure 6:
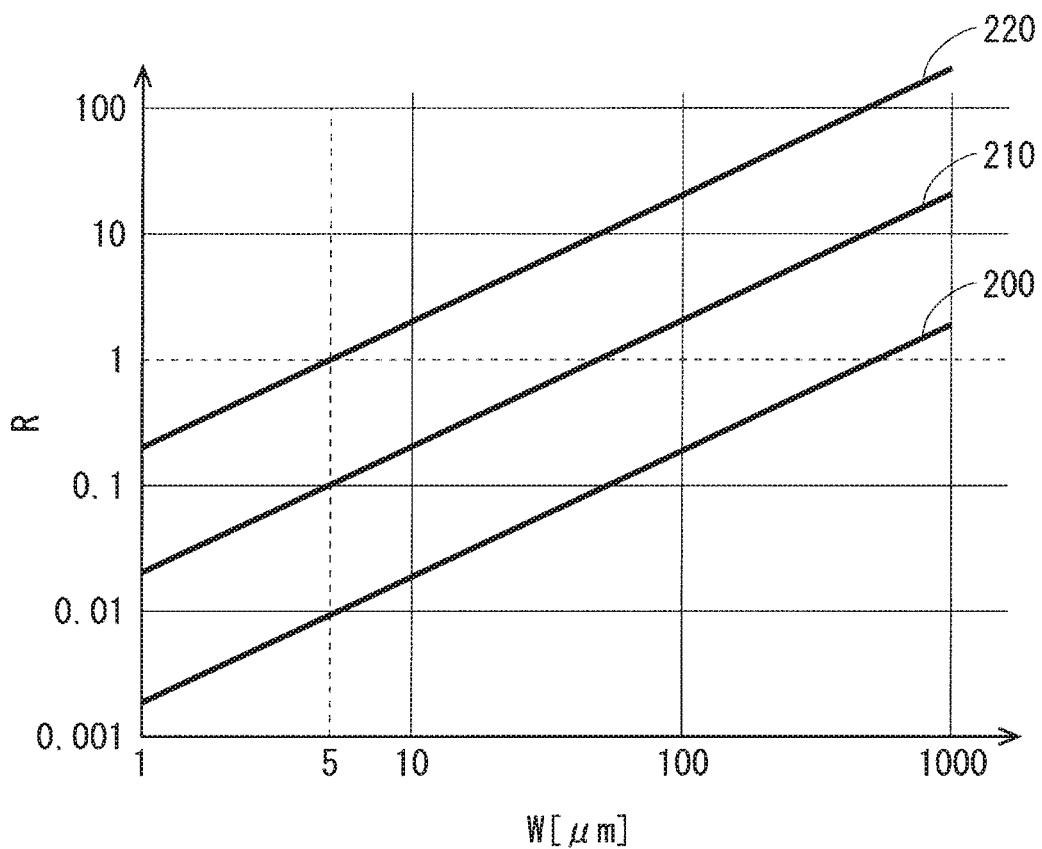
FIG. 6 is a drawing illustrating an example of characteristics of the semiconductor device.

FIG. 6 is a drawing illustrating a relationship between a distance W from the semiconductor region 5 to the region 40 of the semiconductor region 4 in a planar view (refer to FIGS. 3 to 5) and a normalized resistance value R in a current path in the semiconductor region 2. A lateral axis and a vertical axis in FIG. 6 indicate the distance W and the normalized resistance value R, respectively. The distance W is also considered as a width of a region sandwiched between the semiconductor region 5 and the semiconductor region 4 in the semiconductor region 6.

Herein, the normalized resistance value R indicates a value obtained by normalizing a resistance value of the current path in the semiconductor region 2 by a reference value. That it so say, the normalized resistance value R indicates a value obtained by dividing the resistance value of the current path in the semiconductor region 2 by the reference value. The reference value is set to the resistance value of the current path in the semiconductor region 2 in a state where the peak concentration of the semiconductor region 2 is set to the lower limit value ($1\times10^{15}$ cm$^{-3}$) and the distance W=5 μm is satisfied, for example.

A graph 200 in FIG. 6 indicates a relationship between the distance W and the normalized resistance value R in a case where the peak concentration of the semiconductor region 2 is set to the upper limit value ($1\times10^{17}$ cm$^{-3}$). A graph 210 in FIG. 6 indicates a relationship between the distance W and the normalized resistance value R in a case where the peak concentration of the semiconductor region 2 is set to a value between the upper limit value and the lower limit value ($1\times10^{15}$ cm$^3$). A graph 220 in FIG. 6 indicates a relationship between the distance W and the normalized resistance value R in a case where the peak concentration of the semiconductor region 2 is set to the lower limit value.

As illustrated in FIG. 6, as the distance W gets lager, the normalized resistance value R increases. This is because when the distance W gets large, the current path in the semiconductor region 2 is elongated. As the concentration of the semiconductor region 2 gets lower, the normalized resistance value R increases.

The distance W may be set to be equal to or larger than 5 μm in the semiconductor device 100. That is to say, the width of the region sandwiched between the semiconductor region 5 and the semiconductor region 4 in the semiconductor region 6 may be set to be equal to or larger than 5 μm. In this case, the recovery characteristics of the semiconductor device 100 can be improved, and the semiconductor region 6 can be easily formed.

Figure 7:
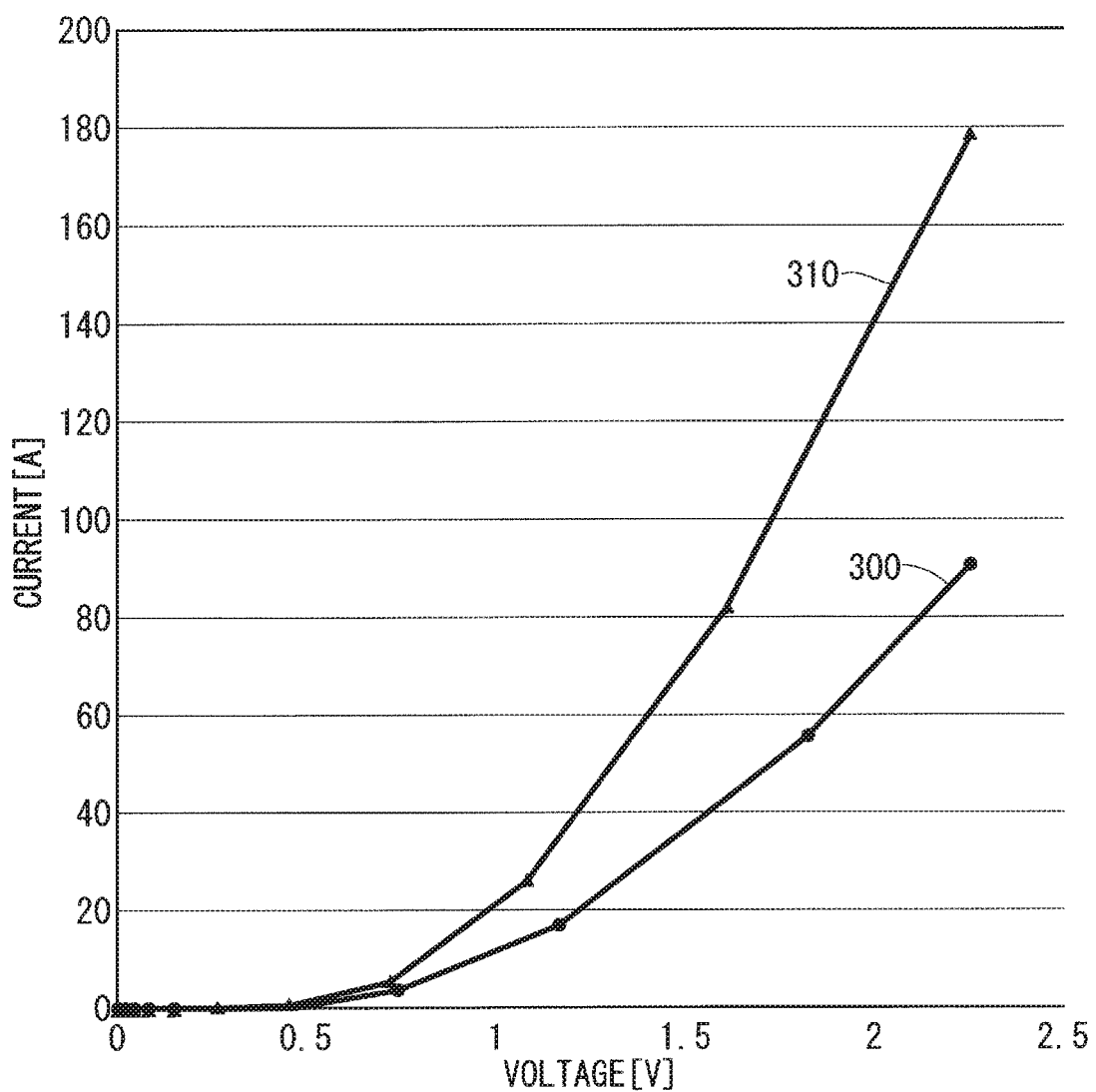
FIG. 7 is a drawing illustrating an example of the characteristics of the semiconductor device.

FIG. 7 is a drawing illustrating output characteristics of the semiconductor device 100 and the second comparative device 160. A graph 300 in FIG. 7 indicates the output characteristics of the semiconductor device 100, and a graph 310 in FIG. 7 indicates the output characteristics of the second comparative device 160. A lateral axis in FIG. 7 indicates the forward bias applied to the semiconductor device 100 and the second comparative device 160. A vertical axis in FIG. 7 indicates a forward current in the semiconductor device 100 and the second comparative device 160. FIG. 7 illustrates the output characteristics of the semiconductor device 100 and the second comparative device 160 at a temperature of 125° C. and withstand voltage of 2.2 kV.

As illustrated in FIG. 7, an on voltage of the semiconductor device 100 is larger than that of the second comparative device 160. This is because the potential of the semiconductor region 2 at the time of application of the forward bias is smaller in the semiconductor device 100 than in the second comparative device 160, and as a result, the implantation efficiency of the positive hole is smaller in the semiconductor device 100 than in the second comparative device 160.

Figure 8:
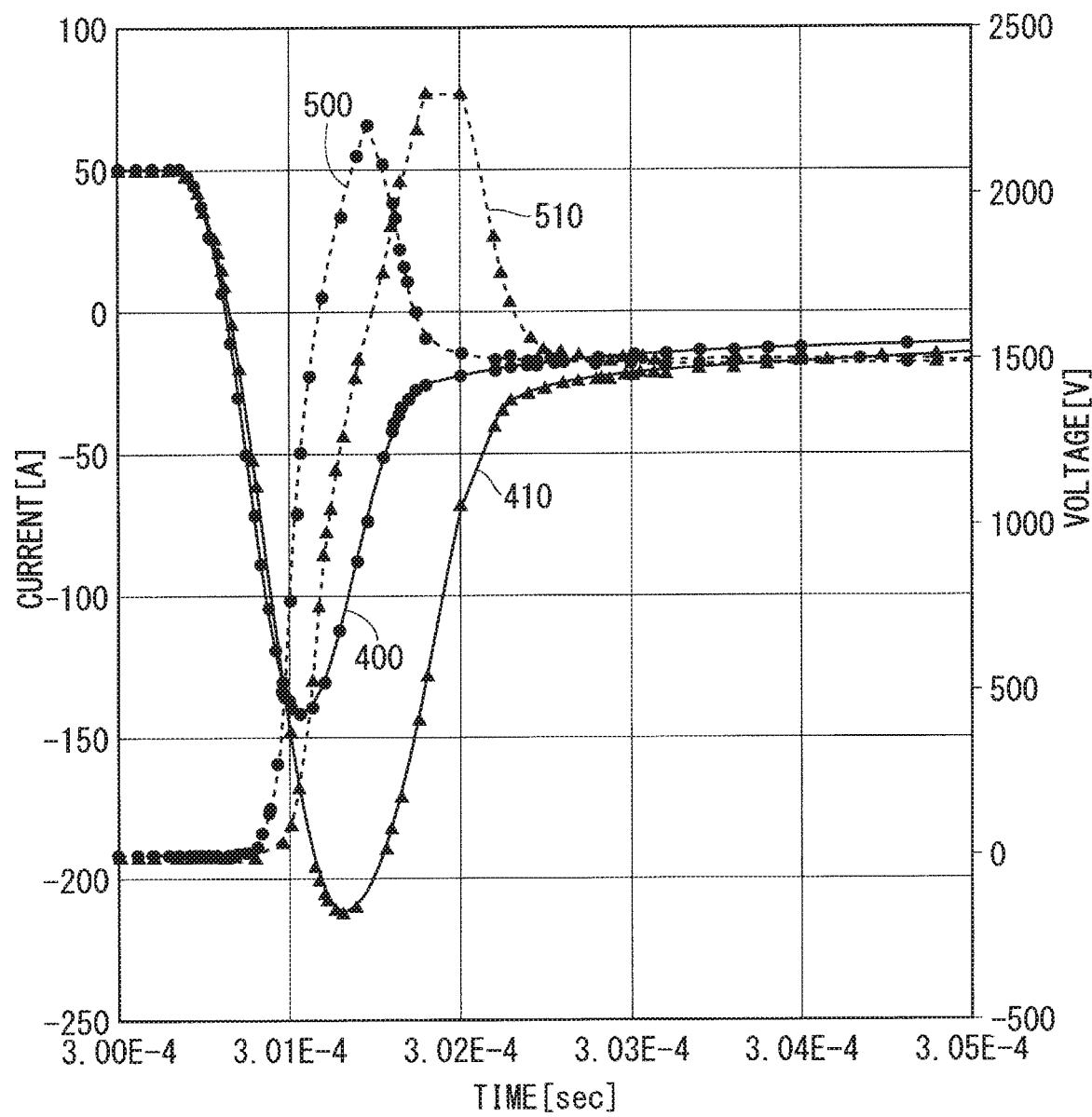
FIG. 8 is a drawing illustrating an example of the characteristics of the semiconductor device.

FIG. 8 is a drawing illustrating the recover characteristics of the semiconductor device 100 and the second comparative device 160. A graph 400 in FIG. 8 indicates a wave form of the forward current in a case where a state of the semiconductor device 100 is changed from an on state to an off state. A graph 500 in FIG. 8 indicates a wave form of a voltage between the cathode electrode 12 and the anode electrode 7 in the case where the state of the semiconductor device 100 is changed from the on state to the off state. A graph 410 in FIG. 8 indicates a wave form of the forward current in a case where a state of the second comparative device 160 is changed from an on state to an off state. A graph 510 in FIG. 8 indicates a wave form of a voltage between the cathode electrode 12 and the anode electrode 7 in the case where the state of the second comparative device 160 is changed from the on state to the off state. A lateral axis in FIG. 8 indicates a time. A vertical axis on a left side in FIG. 8 indicates the forward current, and a vertical axis on a right side in FIG. 8 indicates the voltage between the cathode electrode 12 and the anode electrode 7. FIG. 8 illustrates the recovery characteristics of the semiconductor device 100 and the second comparative device 160 at a temperature of 125° C. and withstand voltage of 2.2 kV.

As illustrated in FIG. 8, in the semiconductor device 100, a peak value of a recovery current (reverse current) is small and a recovery period is also short compared with the second comparative device 160. This is because the implantation efficiency of the positive hole is smaller in the semiconductor device 100 than in the second comparative device 160, and the amount of the accumulated positive hole is smaller in the semiconductor device 100 than in the second comparative device 160.

Figure 10:
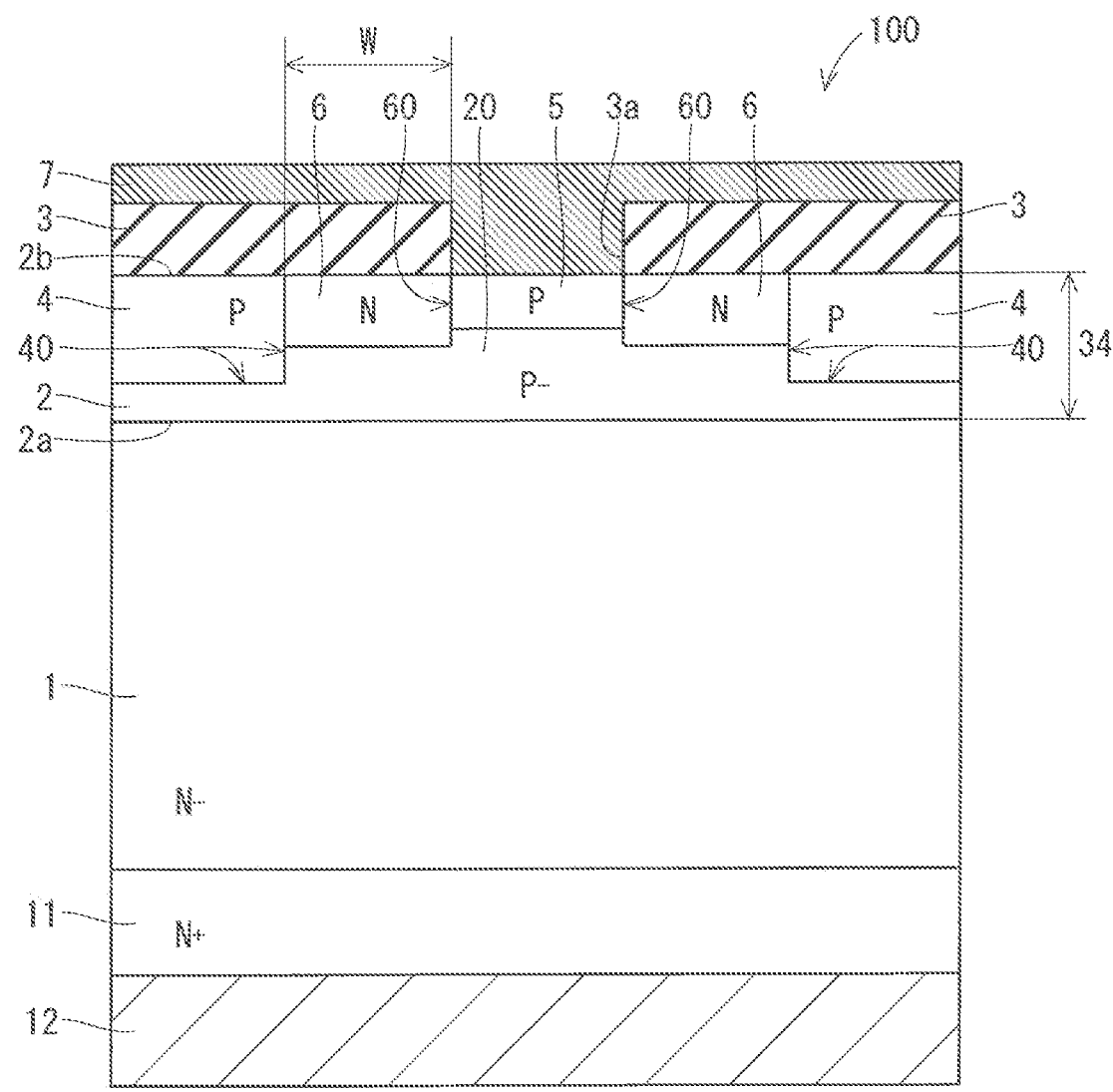
FIG. 10 is a drawing illustrating an example of a cross-sectional structure of the semiconductor device.

The structure of the semiconductor device 100 is not limited to that of the above example. For example, the depth of the semiconductor region 4 is equal to or larger than that of the semiconductor region 2. FIG. 9 illustrates an example of a cross-sectional structure of the semiconductor device 100 in the case where the depth of the semiconductor region 4 is larger than that of the semiconductor region 2. As illustrated in FIG. 10, the depth of the semiconductor region 6 may be larger than that of the semiconductor region 5. In this case, the current path in the semiconductor region 2 having the low concentration gets longer, thus the potential of the semiconductor region 4 in the case where the forward bias is applied to the semiconductor device 100 is further reduced. Thus, the amount of accumulation of the positive hole in the semiconductor device 100 further decreases and as a result, the recovery characteristics of the semiconductor device 100 is further improved. The semiconductor region 6 needs not have contact with the semiconductor region 5. The semiconductor region 6 needs not have contact with the semiconductor region 4. FIG. 11 illustrates an example of a cross-sectional structure of the semiconductor device 100 in a case where the semiconductor region 6 does not have contact with the semiconductor regions 4 and 5. In the semiconductor device 100, the p type region may be changed to the n type region, and the n type region may be changed to the p type region.

Embodiment 2

Figure 12:
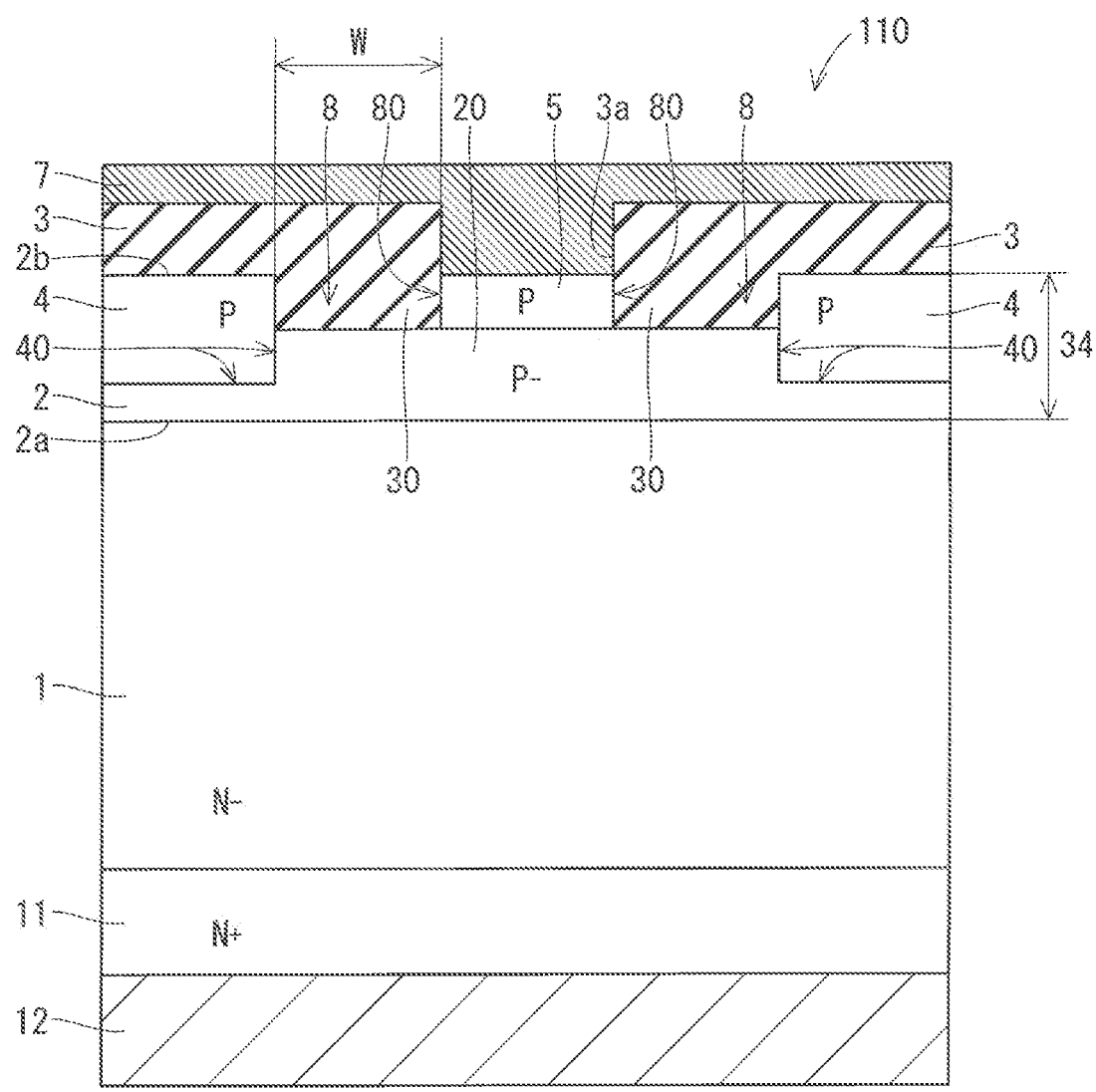
FIG. 12 is a drawing illustrating an example of a cross-sectional structure of the semiconductor device.

FIG. 12 is a drawing illustrating an example of a cross-sectional structure of a semiconductor device 110 according to the present embodiment. The semiconductor device 110 is equivalent to the above semiconductor device 100 in which a concave portion 8 is provided in a region where the semiconductor region 6 is formed in the semiconductor region 2 in place of the semiconductor region 6. It is also applicable that the semiconductor device 110 is equivalent to the semiconductor device 100 in FIG. 4 described above in which the concave portion 8 is provided in the region where the semiconductor region 6 is formed in the semiconductor region 2 in place of the semiconductor region 6. It is also applicable that the semiconductor device 110 is equivalent to the semiconductor device 100 in FIG. 5 described above in which the concave portion 8 is provided in the region where the semiconductor region 6 is formed in the semiconductor region 2 in place of the semiconductor region 6.

The concave portion 8 is formed by engraving a concave portion by dry etching in the main surface 2b of the semiconductor region 2 in a thickness direction, for example. The concave portion 8 is also considered as the engraved portion. A depth of the concave portion 8 is smaller than that of each of the semiconductor regions 2 and 4. The depth of the concave portion 8 is the same as that of the semiconductor region 5. The concave portion 8 is filled with the insulating film 3. The insulating film 3 has contact with the semiconductor regions 2, 4, and 5. The insulating film 3 covers a region where the semiconductor regions 4 and 5 are not formed in the semiconductor region 2 in a planar view.

The concave portion 8 includes part 80 sandwiching the semiconductor region 5 in a planar view. The concave portion 8 is filled with the insulating film 3, thus the insulating film 3 is considered to have part 30 sandwiching the semiconductor region 5 in a direction rectangular to a thickness direction of the semiconductor device 110.

The semiconductor device 110 having the above configuration has characteristics similar to those of the semiconductor device 100 illustrated in FIGS. 6 to 8 described above. The distance W in the semiconductor device 110 is also considered as a width of a region sandwiched between the semiconductor region 5 and the semiconductor region 4 in the concave portion 8. The distance W is also considered as a width of a region sandwiched between the semiconductor region 5 and the semiconductor region 4 in the insulating film 3 which fills the concave portion 8.

In the semiconductor device 110 according to the present embodiment, when the forward bias is applied to the semiconductor device 110 in the manner similar to the semiconductor device 100, the potential of the semiconductor region 4 is equal to a value obtained by subtracting a value of voltage drop in the semiconductor region 2 having the low concentration from the potential of the anode electrode 7. Furthermore, there is the concave portion 8 between the p type semiconductor region 5 having contact with the anode electrode 7 and the p type semiconductor region 4 in the semiconductor device 110, and the concave portion 8 is filled with the insulating film 3. Thus, when the forward bias is applied to the semiconductor device 100, a current flowing from the semiconductor region 5 toward the semiconductor region 4 flows without passing through the concave portion 8. As a result, a current path in the semiconductor region 2 having the low concentration is elongated. Thus, the potential of the semiconductor region 4 in the case where the forward bias is applied to the semiconductor device 100 can be further reduced. Accordingly, the supply of the positive hole from the anode region 34 is suppressed, and an amount of accumulation of the positive hole in the semiconductor device 110 decreases. As a result, recovery characteristics of the semiconductor device 110 is improved.

When the reverse bias is applied to the semiconductor device 110, the extension of the depletion layer from the intermediate semiconductor region 1 to the anode region 34 is suppressed not only by the semiconductor region 4 but also by the semiconductor region 5 having the high impurity concentration. Thus, a possibility of breakdown is reduced in the semiconductor device 110.

The anode electrode 7 does not have contact with the semiconductor region 2 having the low concentration, but has contact with the semiconductor region 5 having the high concentration. Thus, even when the concentration of the semiconductor region 2 is set low, the ohmic contact between the anode electrode 7 and the semiconductor region 5 can be achieved. When the concentration of the semiconductor region 2 is set low, the resistance component caused by the semiconductor region 2 can be increased, thus the potential of the semiconductor region 4 in the case where the forward bias is applied to the semiconductor device 110 can be further reduced. Thus, the supply of the positive hole from the anode region 34 is further suppressed. As a result, the ohmic contact between the anode electrode 7 and the semiconductor region 5 is achieved, and the recovery characteristics of the semiconductor device 110 is further improved.

When the reverse bias is applied to the semiconductor device 100 according to the embodiment 1, there is a possibility that electrical field is concentrated in a PN junction between the semiconductor region 5 and the semiconductor region 6. Thus, there is a possibility that impact ionization occurs and a hole carrier increases. As a result, there is a possibility that a degree of improvement of the recovery characteristics cannot be increased so much in the semiconductor device 100.

In contrast, in the semiconductor device 110 according to the present embodiment, the concave portion 8 is formed in place of the semiconductor region 6, and the concave portion 8 is filled with the insulating film 3, thus there is no n type semiconductor region having contact with the semiconductor region 5. Thus, in the semiconductor device 110, the possibility of the increase in the hole carrier caused by the impact ionization can be reduced. Thus, the degree of improvement of the recovery characteristics can be increased.

The distance W may be set to be equal to or larger than 5 μm in the semiconductor device 110. That is to say, the width of the region sandwiched between the semiconductor region 5 and the semiconductor region 4 in the concave portion 8 may be set to be equal to or larger than 5 μm. In this case, the recovery characteristics of the semiconductor device 100 can be improved, and the concave portion 8 can be easily formed.

Figure 13:
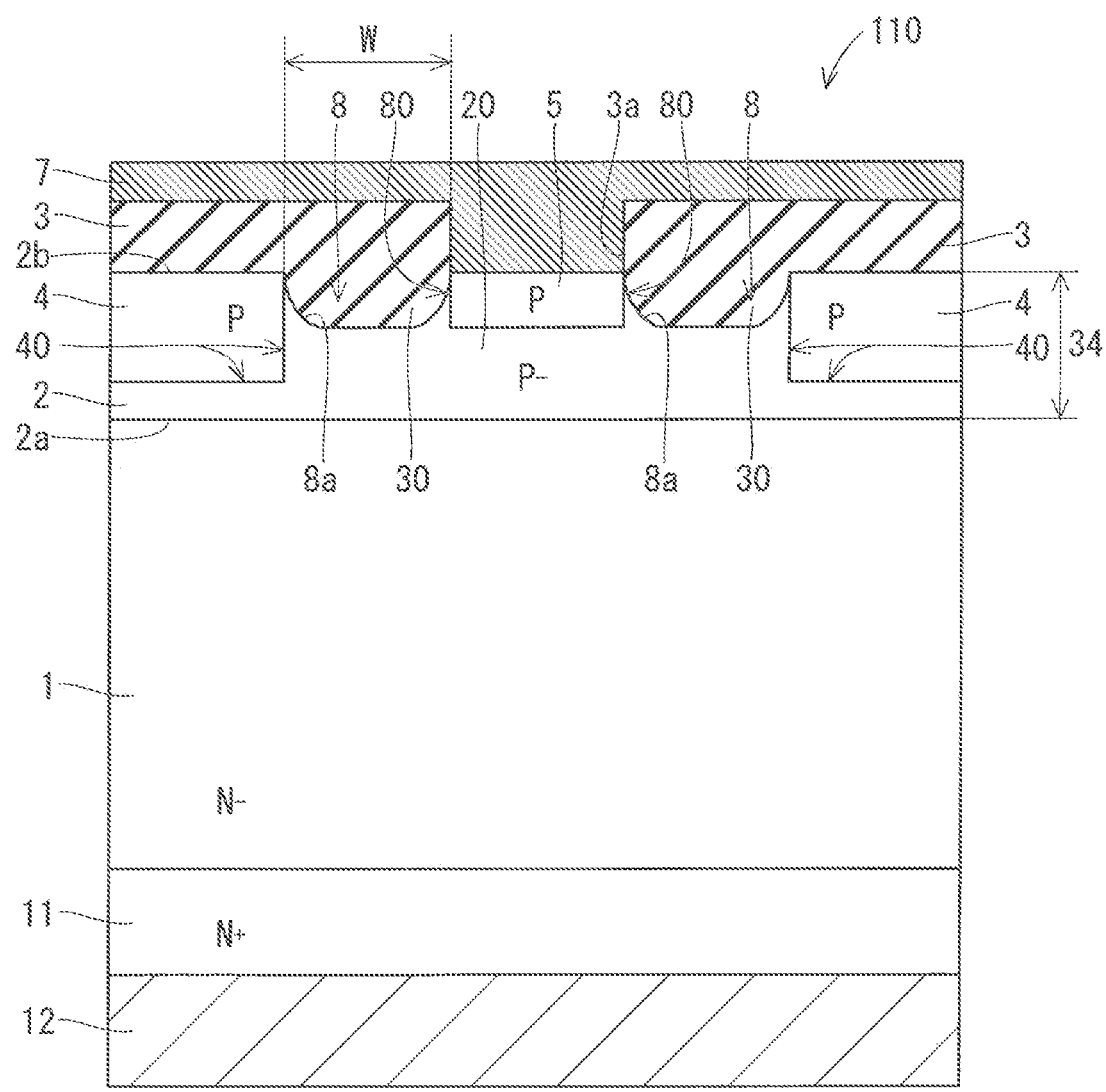
FIG. 13 is a drawing illustrating an example of a cross-sectional structure of the semiconductor device.

The structure of the semiconductor device 110 is not limited to that of the above example. For example, the shape of the concave portion 8 may have a shape other than the shape illustrated in FIG. 12. For example, as illustrated in FIG. 13, an inner side surface 8a of the concave portion 8 is formed into a tapered shaped tapered with increase in depth. The shape of the concave portion 8 may have a shape other than the shape illustrated in FIGS. 12 and 13.

Figure 15:
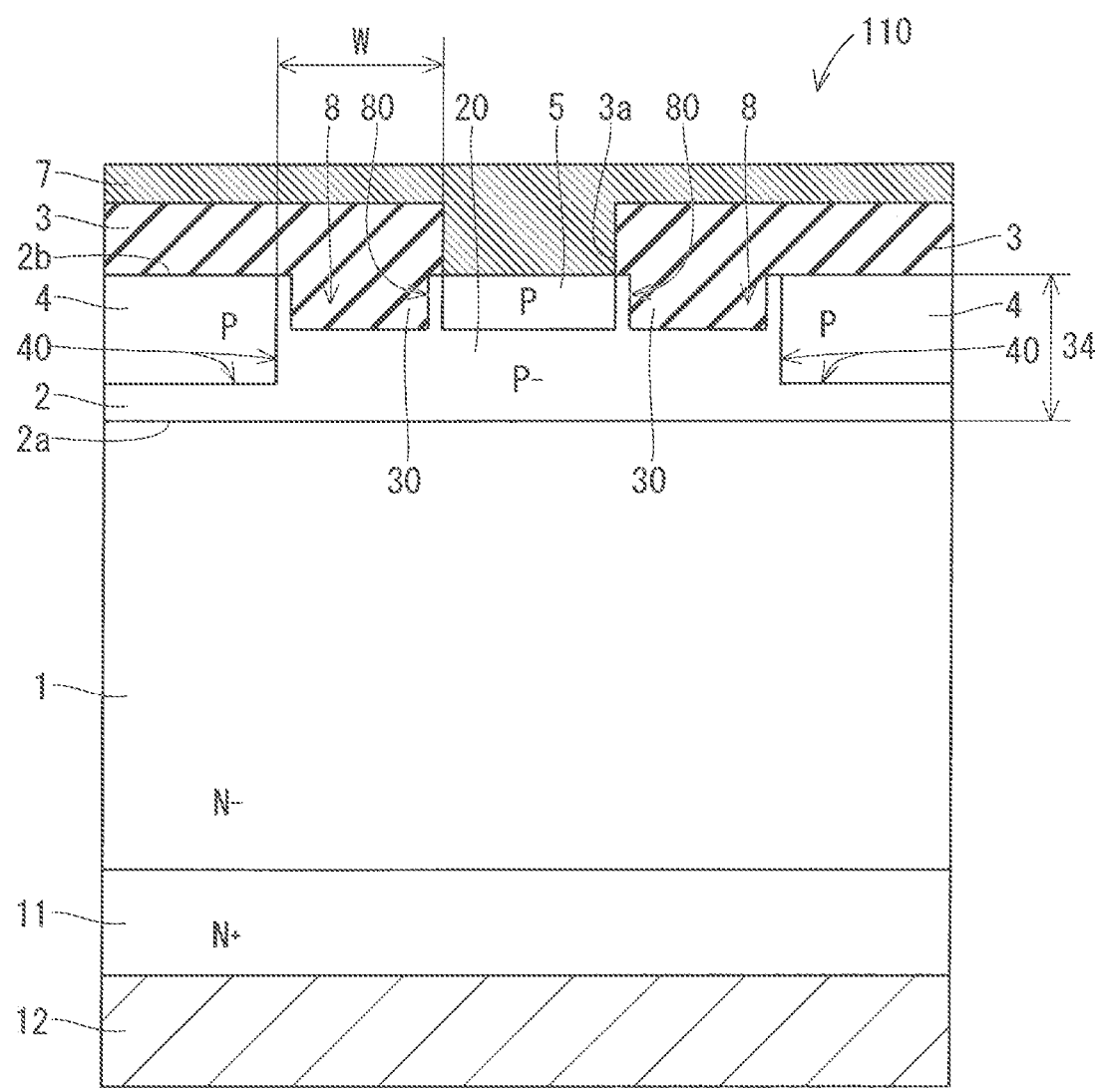
FIG. 15 is a drawing illustrating an example of a cross-sectional structure of the semiconductor device.

The depth of the semiconductor region 4 may be equal to or larger than that of the semiconductor region 2 also in the semiconductor device 110. As illustrated in FIG. 14, the depth of the concave portion 8 may be larger than that of the semiconductor region 5. In this case, the current path in the semiconductor region 2 having the low concentration gets longer, thus the potential of the semiconductor region 4 in the case where the forward bias is applied to the semiconductor device 110 is further reduced. Thus, the amount of accumulation of the positive hole in the semiconductor device 110 further decreases and as a result, the recovery characteristics of the semiconductor device 110 is further improved. There may be the semiconductor region 2 between the concave portion 8 and the semiconductor region 5. There may be the semiconductor region 2 between the concave portion 8 and the semiconductor region 4. FIG. 15 illustrates an example of a cross-sectional structure of the semiconductor device 110 in a case where there is the semiconductor region 2 between the concave portion 8 and the semiconductor region 4 and between the concave portion 8 and the semiconductor region 5. In the semiconductor device 110, the p type region may be changed to the n type region, and the n type region may be changed to the p type region.

According to the present invention, the above embodiments can be arbitrarily combined, or each embodiment can be appropriately varied or omitted within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:
   a first semiconductor region of a first conductivity type;
   a second semiconductor region of a second conductivity type located on the first semiconductor region;
   a third semiconductor region of the second conductivity type located on the second semiconductor region and having a higher impurity concentration than the second semiconductor region;
   a fourth semiconductor region of the second conductivity type having a higher impurity concentration than the second semiconductor region, located separately from the third semiconductor region in a planar view, and having contact with the second semiconductor region;
   a fifth semiconductor region of the first conductivity type located on the second semiconductor region and located between the third and fourth semiconductor regions in a planar view, wherein the third semiconductor region is in direct contact with the fifth semiconductor region; and
   an electrode not in direct contact with the fourth and fifth semiconductor regions but having contact with the third semiconductor region.

2. The semiconductor device according to claim 1, wherein
   a depth of the fifth semiconductor region is equal to or larger than a depth of the third semiconductor region.
3. The semiconductor device according to claim 1, wherein
   the electrode is in direct contact with the third semiconductor region.
4. The semiconductor device according to claim 1, wherein
   a portion of the fourth semiconductor region sandwiches a part of the second semiconductor region in a direction perpendicular to a depth direction of the second semiconductor region.
5. The semiconductor device according to claim 1, wherein
   a depth of a bottom surface of the fourth semiconductor region is greater than a depth of a bottom surface of the third semiconductor region and is greater than a depth of a bottom surface of the fifth semiconductor region.

* * * * *